United States Patent
Rodgers

(10) Patent No.: US 6,568,133 B1
(45) Date of Patent: May 27, 2003

(54) BEVERAGE HOLDER TRAY ON OUTDOOR ENCLOSURE

(75) Inventor: Jane Rodgers, Sebastopol, CA (US)

(73) Assignee: Calix Networks, Inc., Petaluma, CA (US)

( * ) Notice: Subject to any disclaimer, the term of this patent is extended or adjusted under 35 U.S.C. 154(b) by 0 days.

(21) Appl. No.: 10/081,672

(22) Filed: Feb. 21, 2002

(51) Int. Cl.⁷ .................................. E04B 1/00
(52) U.S. Cl. ......................... 52/79.1; 52/79.9; 224/0.5
(58) Field of Search ............... 52/79.1, 79.2, 52/79.3, 79.4, 79.5, 79.6, 79.7, 79.8, 79.9, 79.11, 79.12, 79.13, 79.14; 248/682, 128, 146; 224/0.5

(56) References Cited

U.S. PATENT DOCUMENTS

| | | | | |
|---|---|---|---|---|
| 3,807,674 A | * | 4/1974 | Justen | 248/311.2 |
| 4,013,328 A | * | 3/1977 | Wolf et al. | 433/33 |
| 4,546,237 A | * | 10/1985 | Collins | 392/498 |
| 4,645,157 A | * | 2/1987 | Parker | 248/311.2 |
| 4,942,328 A | * | 7/1990 | Price | 312/306 |
| 4,944,566 A | * | 7/1990 | Carper | 312/311 |
| 5,533,697 A | * | 7/1996 | Fletcher et al. | 248/146 |
| 5,551,616 A | * | 9/1996 | Stitt et al. | 224/275 |
| 5,934,637 A | * | 8/1999 | Robinson | 248/311.2 |
| 6,349,906 B1 | * | 2/2002 | Anderson | 248/146 |

\* cited by examiner

*Primary Examiner*—Jeanette Chapman
(74) *Attorney, Agent, or Firm*—Silicon Valley Patent Group LLP; Omkar Suryadevara

(57) ABSTRACT

An outdoor enclosure including a main compartment housing electronic components and a door coupled to the main compartment. A beverage holder tray is mounted on an inner surface of the door. The beverage holder tray may be folded into a closed position and unfolded into an open position.

12 Claims, 7 Drawing Sheets

BEVERAGE HOLDER TRAY ON OUTDOOR ENCLOSURE

BACKGROUND OF THE INVENTION

There are many types of outdoor enclosures (also called cabinets) that house electronic components. For example, Marconi Communications, Inc. (see http://www.marconi.com/html/solutions/section 1 crossconnectcabinets.htm) has a line of Universal Series Cross-Connect Cabinets manufactured of heavy gauge mill-galvanized steel with moisture and insect barrier base, overhanging rain guards, closed cell neoprene door gasketing, and screened louvers. Some of the accessories that can be attached to the inside of the door assembly includes spool mounting hardware, tester dish, cable assignment chart, and jumper routing diagram.

SUMMARY OF THE INVENTION

In accordance with this invention, a tray for supporting a beverage holder (such as a coffee cup) is mounted on an inner surface of a door coupled to a main compartment of an outdoor enclosure that houses electronic components. A worker opening the door of the outdoor enclosure can unfold the tray into an open position, then place his coffee cup in the tray before commencing work on the electronic components. While working on the electronic components, the worker can drink his coffee or other beverage from the coffee cup.

DETAILED DESCRIPTION

Figure 1:
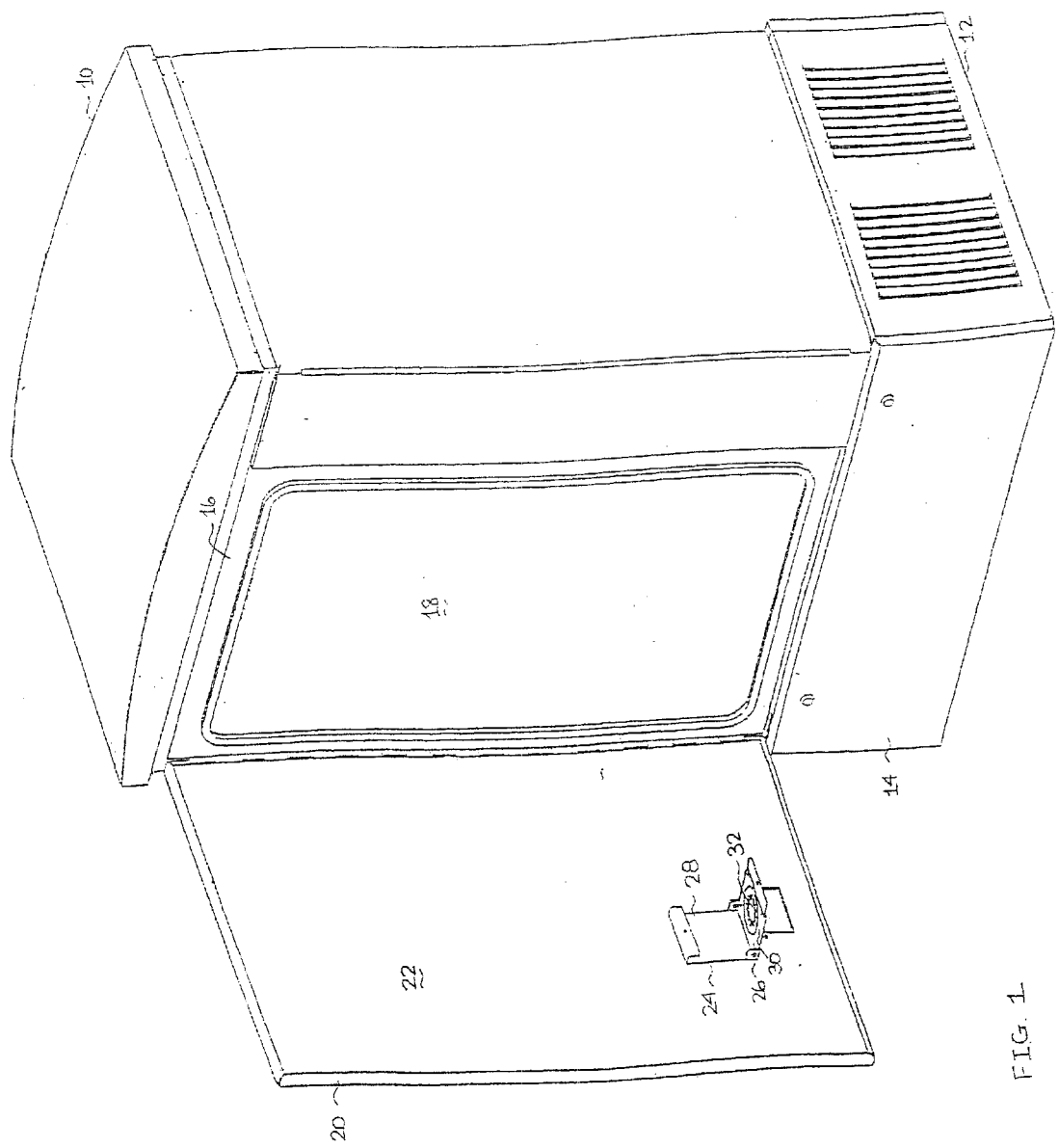
FIG. 1 illustrates a perspective view of an outdoor enclosure in accordance with the invention that has a beverage holder tray mounted on an inner surface of a door coupled to a main compartment of the outdoor enclosure.

In accordance with an embodiment of the invention, FIG. 1 illustrates a perspective view of an outdoor enclosure 10 with a tray 24. Outdoor enclosure 10 includes a main compartment 16 with an interior 18 to house electronic components (not shown). A door 20 is coupled to the main compartment 16 in a manner well-known in the art (for example, riveted or hinged). The door 20 has an inner surface 22 which faces the interior 18 of the main compartment 16 when the door 20 is shut. When door 20 is shut, compartment 16 is sealed in a waterproof manner by a gasket (e.g. of neoprene). Tray 24 (hereinafter "beverage holder tray 24") is mounted on the inner surface 22 of door 20 in a manner well-known in the art (for example, welded).

Figure 2:
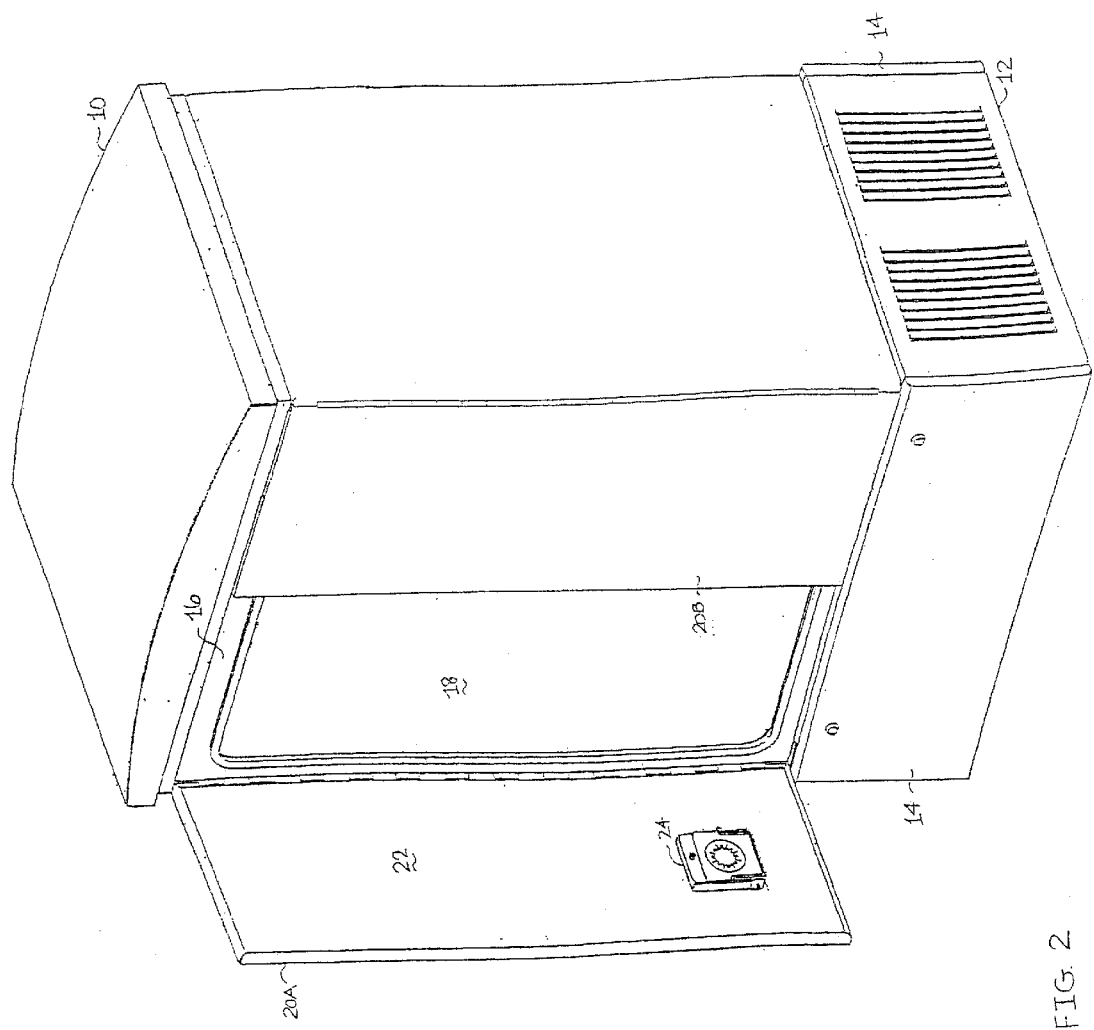
FIG. 2 illustrates a perspective view of an embodiment of an outdoor enclosure with a plurality of doors and access panels.

Numerous designs of beverage holder trays may be used depending on the embodiment. The beverage holder tray 24 of the embodiment illustrated in FIG. 1 includes a hinge 26 with a first portion 28 mounted on the inner surface 22 of door 20 and a second portion 30 with an opening 32 of a size large enough to receive a beverage holder (for example, a coffee cup and/or a soda can). As shown in FIGS. 1 and 2, the holder tray 24 of this embodiment may be unfolded into an open position and folded into a closed position. In general, a worker (not shown) will open door 20 to the outdoor enclosure 10 to work on the electronic components therein. Frequently, the worker will bring along a beverage to drink, such as coffee in a flask or cup. Since the worker is outside, it is more convenient for the worker to place his coffee cup in the beverage holder tray 24 rather than on top of the outside enclosure 10, where a spill could easily damage the electronic components, or on the ground, where the worker may accidentally knock over the coffee cup, where the worker may forget to take the coffee cup with him when he leaves, or where ants and other insects could crawl into the cup.

The main compartment 16 in FIG. 1 is adjacent to (e.g., located on top of) a battery compartment 12 for housing backup batteries that supply power to the electronic components in case of power failure. Note that in other embodiments battery compartment 12 may be in a different position relative to main compartment 16 or may even be omitted altogether. In some embodiments, each of compartments 12 and 16 may be formed as a separate module and then coupled together to form the outdoor enclosure 10. There may be through hole in a wall between compartments 12 and 16 for passage of cable that supplies power from the batteries to the components in case of power failure. An access panel 14 is affixed to the battery compartment 12 in a manner well-known in the art (for example, bolted or screwed).

Figure 3:
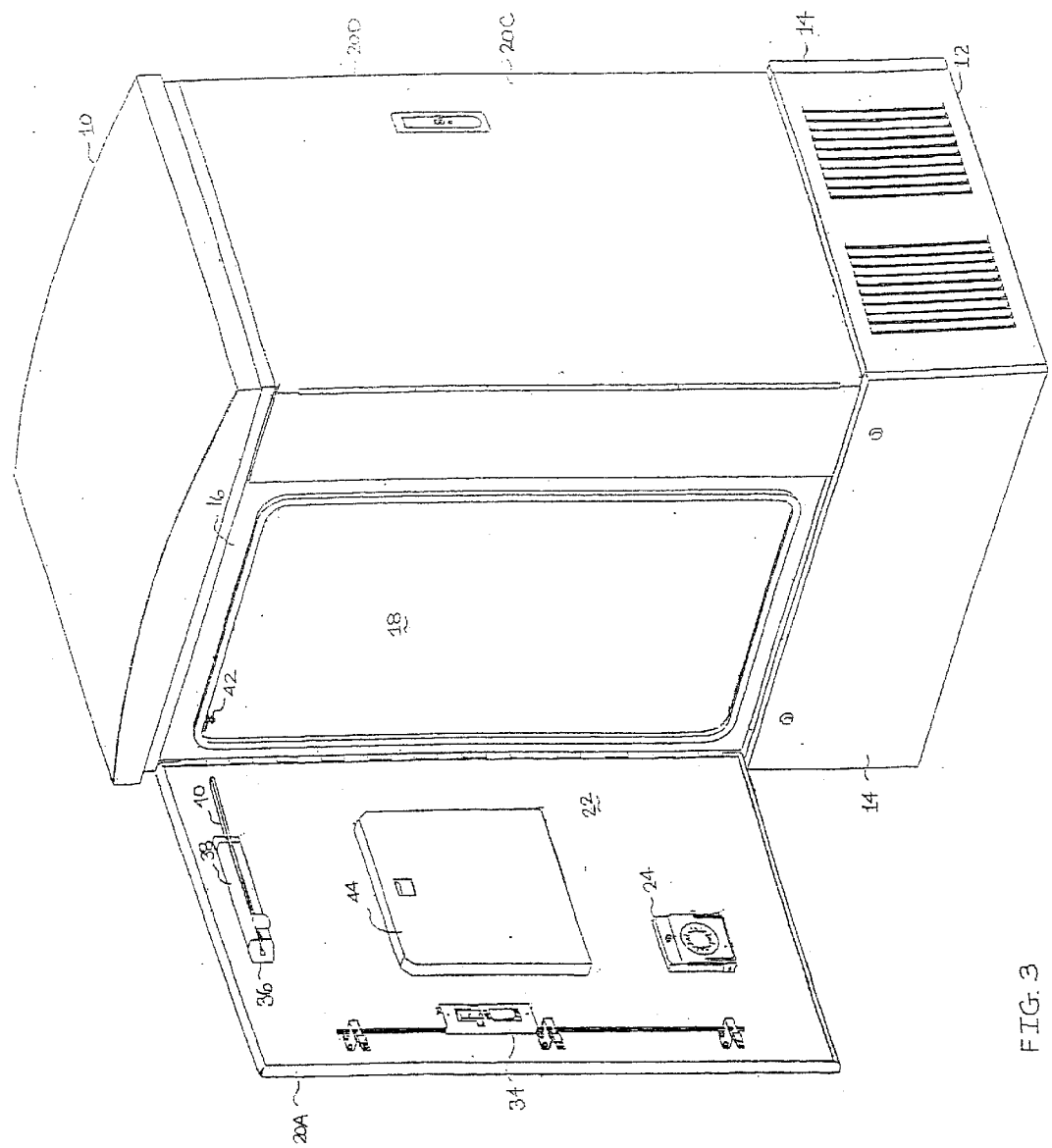
FIG. 3 illustrates a perspective view of an embodiment of an outdoor enclosure with a laptop holder tray and a beverage holder tray mounted on an inner surface of a door coupled to a main compartment of the outdoor enclosure.

In some embodiments of the invention, as seen in FIGS. 2 and 3, several access panels 14A and 14B (out of view) are affixed to the battery compartment 12 and several doors 20A, 20B, 20C and 20D (out of view) are coupled to the main compartment 16. Although several beverage holder trays 24 are mounted on the inner surfaces of respective doors 20A, 20C and 20D in these embodiments, only one beverage holder tray 24 is illustrated in FIGS. 2 and 3 as the view of the inner surfaces of doors 20C and 20D are obstructed.

In the particular embodiment of FIG. 3, a latch lock 34 is attached to the inner surface 22 of door 20A. Latch lock 34 prevents unauthorized access to the electronic components housed within the outdoor cabinet 10. A bracket 36, which prevents door 20A from shutting during windy conditions, defines a body 38 attached to the inner surface 22 of door 20A and an arm 40 usually coupled to a knob 42 in the main compartment 16. Arm 40 is illustrated as uncoupled from knob 42 in FIG. 3 for clarity. A laptop holder tray 44, shown folded in a closed position, is mounted on the inner surface 22 of door 20A at a position above the beverage holder tray 24. The beverage holder tray 24 need not be located below the laptop holder tray 44 in other embodiments, though the relative position shown in FIG. 3 is preferable since a spill at the beverage holder tray 24 during placement of a coffee cup therein will not affect a laptop computer if present on the laptop holder tray 44. Numerous other laptop holder tray designs may be used instead.

Figure 4:
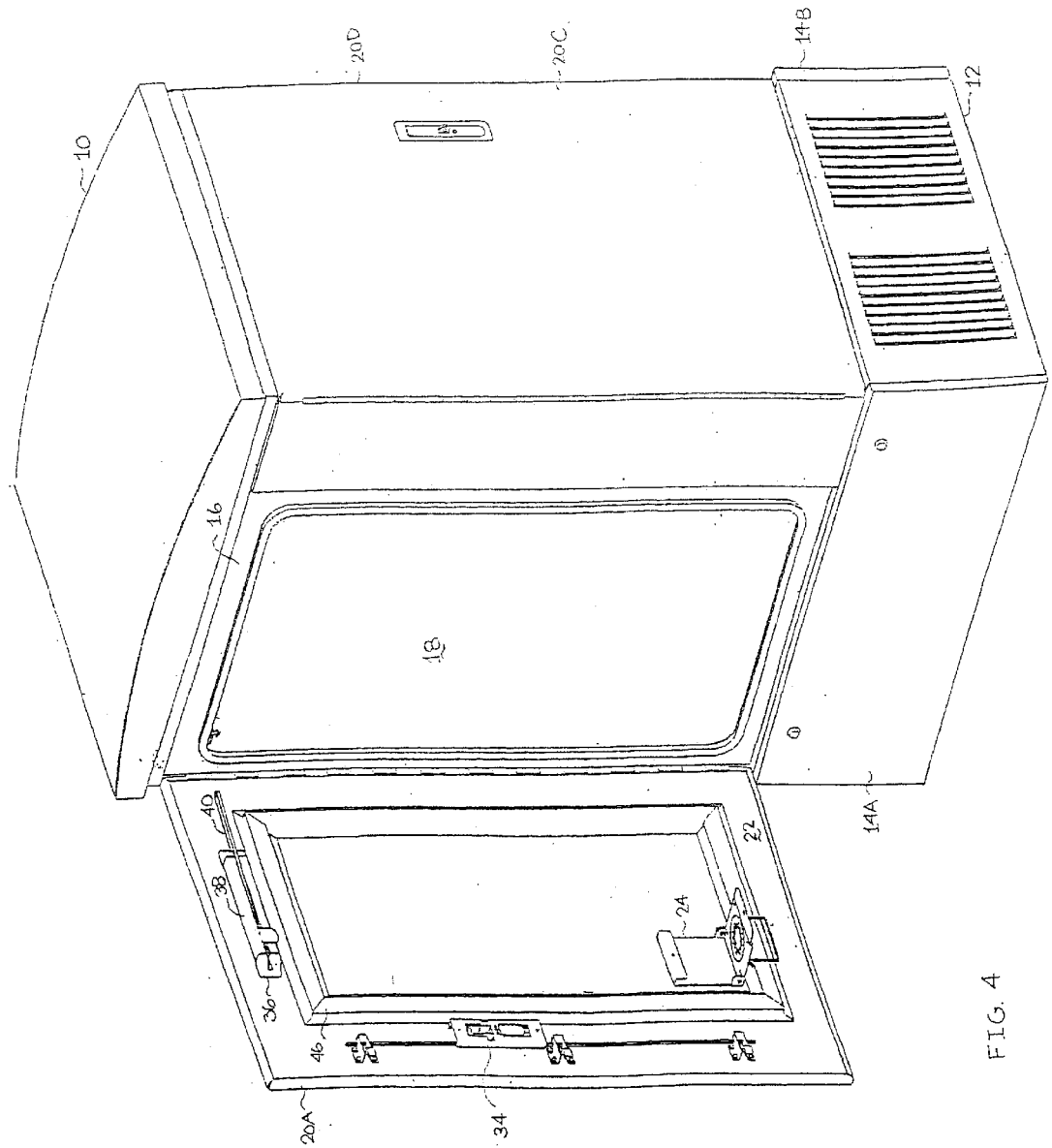
FIG. 4 illustrates a perspective view of an embodiment of an outdoor enclosure with a beverage holder tray mounted on a stiffening panel attached to an inner surface of a door coupled to a main compartment of the outdoor enclosure.
Figure 5:
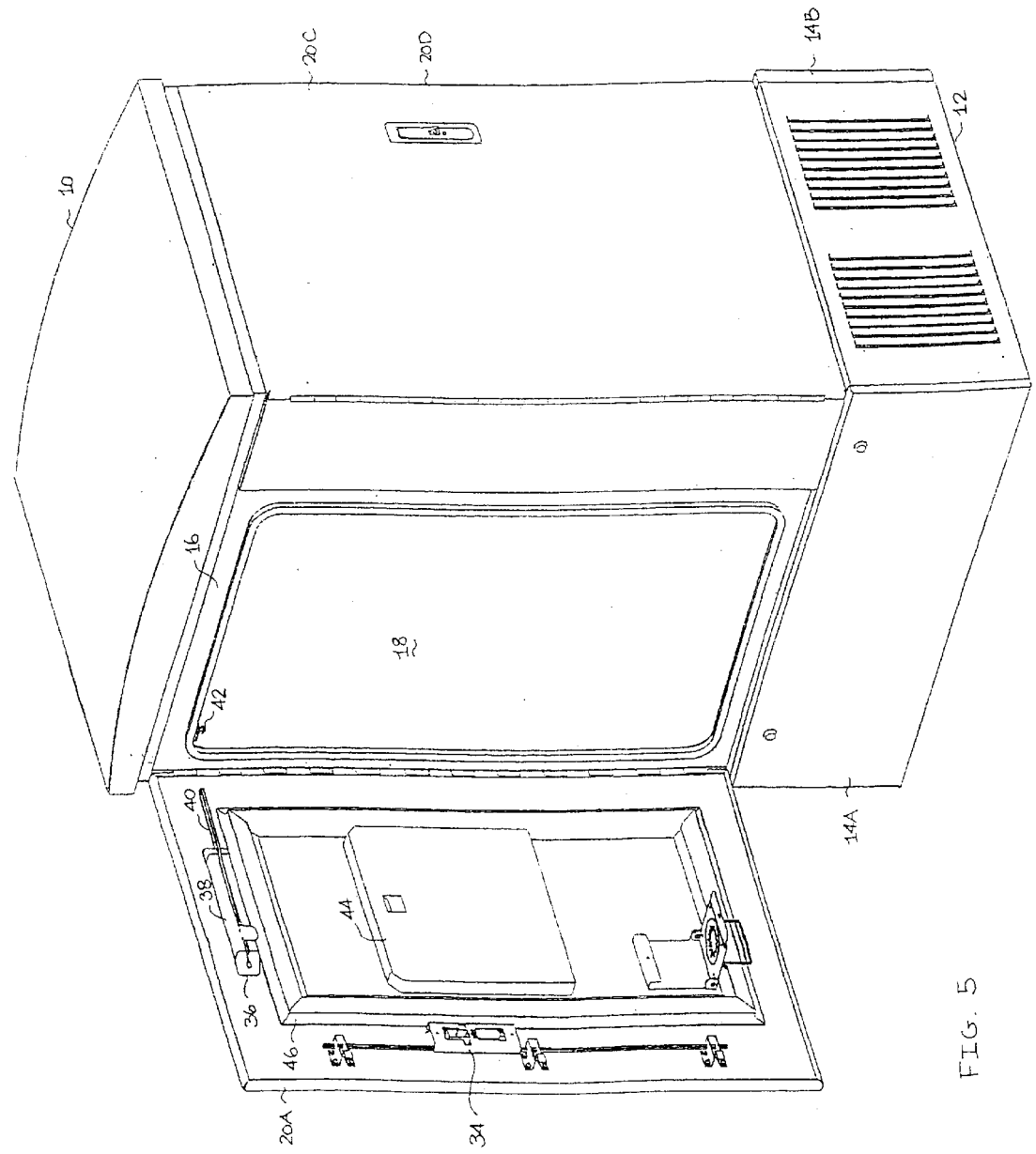
FIG. 5 illustrates a perspective view of an embodiment of an outdoor enclosure with a laptop holder tray and a beverage holder tray mounted on a stiffening panel attached to the inner surface of a door coupled to a main compartment of the outdoor enclosure.

FIG. 4 illustrates an alternative embodiment of the invention where the beverage holder tray 24 is mounted on a stiffening panel 46 attached to the inner surface 22 of door 20A in a manner well-known in the art (for example, welded), rather than directly on the inner surface 22 of door 20A as shown in FIG. 1. Additionally, the laptop holder tray 44 may also be mounted on stiffening panel 46 (shown in FIG. 5).

Figure 6B:
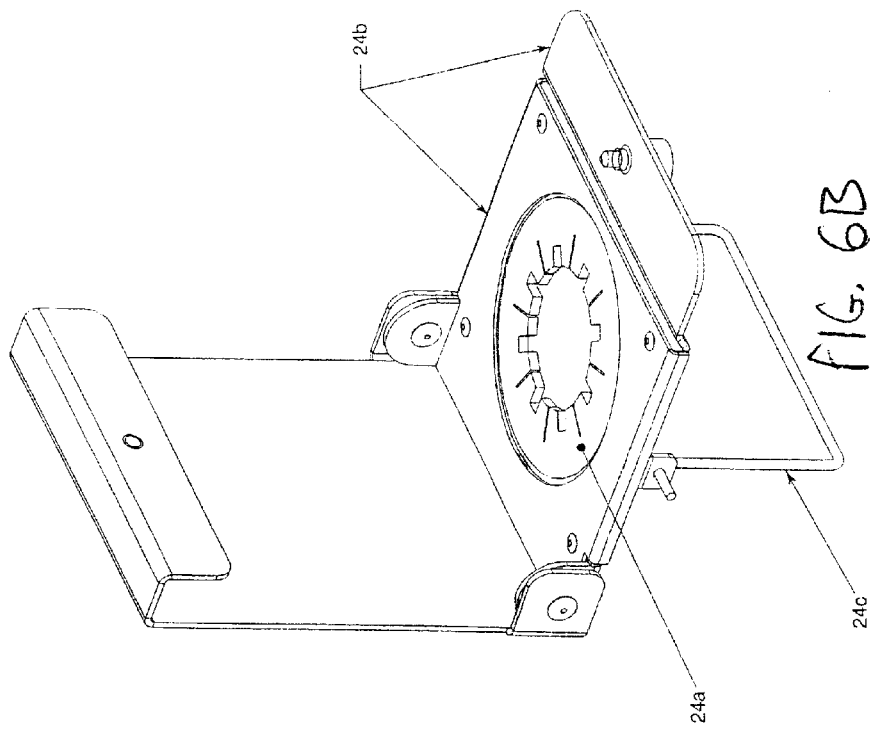
FIGS. 6A and 6B illustrate, in perspective views from the left and right, a close-up of a beverage holder in an open position.
Figure 6A:
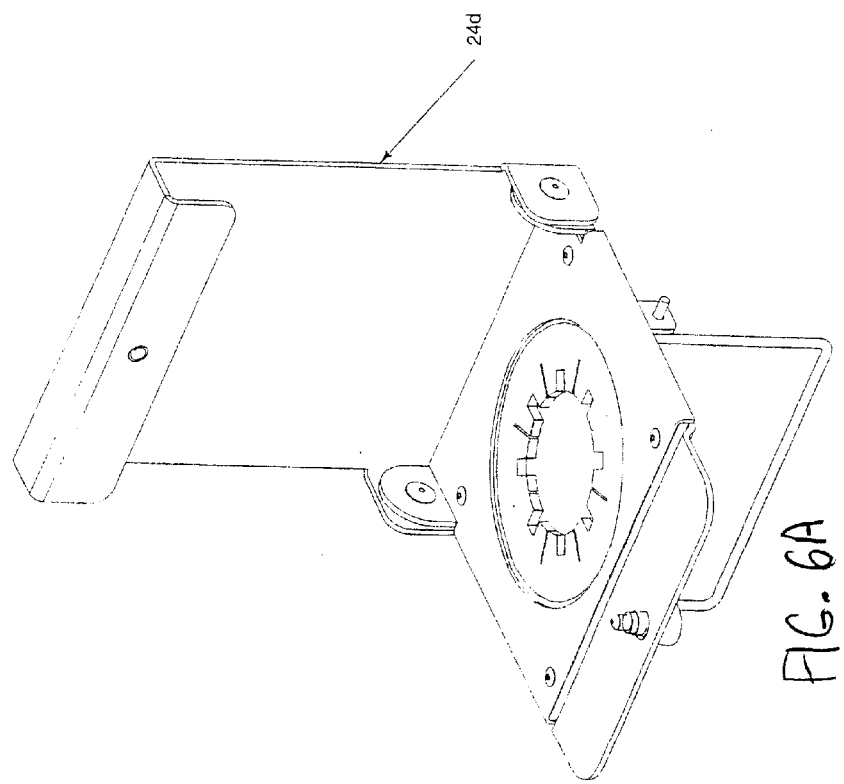
Figure 7B:
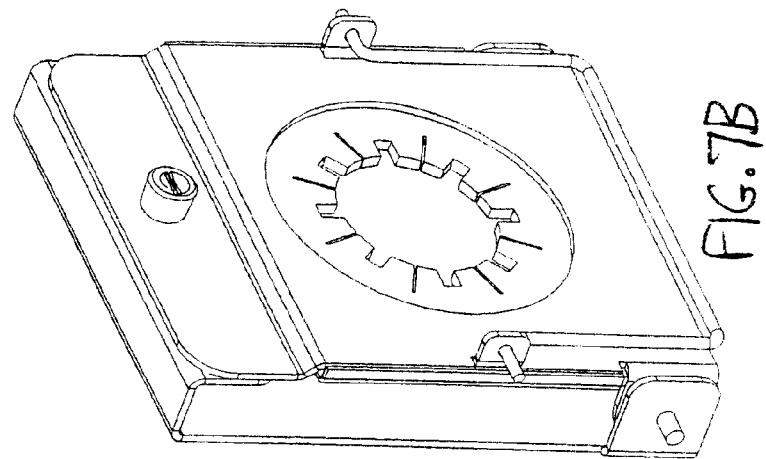
FIGS. 7A and 7B illustrate, in perspective views from the left and right, a close-up of a beverage holder in a closed position.
Figure 7A:
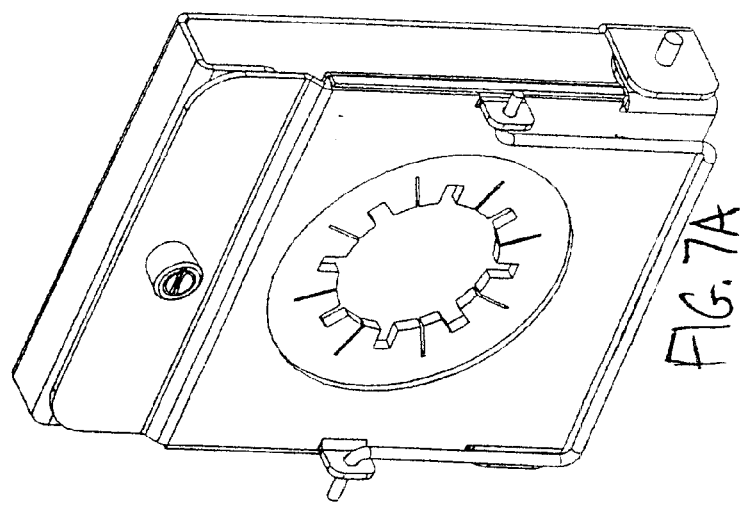

FIGS. 6A and 6B illustrate a beverage holder of one embodiment in the open position, wherein a gasket 24a allows the beverage holder to accommodate various sizes of beverage containers. The beverage holder of this embodiment includes a mechanism 24b for holding a frame of the beverage holder and the gasket 24a together, e.g. by rivets. The illustrated beverage holder includes a wire bail 24c illustrated in the open position to prevent non-tapered beverage containers, such as, aluminum cans, from falling out of the beverage holder. The beverage holder also includes a flat portion 24d that is spot-welded to the door 20. FIG. 7 illustrates the beverage holder in the closed position to show how compact the beverage holder is when in the closed position (so that door 20 can be closed with very little room in the main compartment being occupied by the beverage holder).

It is to be understood that outdoor enclosure 10, when used, is filled with various electronic components and batteries. These components and batteries are not illustrated for the sake of clarity.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as falling within the true spirit and scope of this invention.

I claim:

1. An outdoor enclosure, comprising:
   a main compartment with an interior to house electronic components;
   a door coupled to the main compartment, the door having an inner surface facing the interior of the main compartment when the door is shut;
   a beverage holder tray mounted on the inner surface of the door; and
   a battery compartment for housing batteries, the battery compartment being adjacent to the main compartment, with a passage therethrough for cables supplying power from batteries to the electronic components in case of power failure.

2. The outdoor enclosure of claim 1, wherein the beverage holder tray comprises a hinge with a first portion mounted on the inner surface of the door, and a second portion with an opening of a size large enough to receive a beverage holder.

3. The outdoor enclosure of claim 1, wherein the beverage holder tray may be folded into a closed position and unfolded into an open position.

4. The outdoor enclosure of claim 1, further comprising:
   a plurality of doors coupled to the main compartment, the plurality of doors having a corresponding plurality of inner surfaces; and
   a plurality of beverage holder trays, each beverage holder tray is mounted on the inner surface of a corresponding door.

5. The outdoor enclosure of claim 1, further comprising a latch lock attached to the inner surface of the door.

6. The outdoor enclosure of claim 1, further comprising a bracket having a body and an arm, the body of the bracket is attached to the inner surface of the door, the arm of the bracket is coupled to the main compartment.

7. The outdoor enclosure of claim 1, further comprising a laptop holder tray mounted on the inner surface of the door.

8. The outdoor enclosure of claim 7, wherein the laptop holder tray comprises means for folding into a closed position and unfolding into an open position.

9. The outdoor enclosure of claim 7, wherein the laptop holder tray is mounted on the inner surface of the door at a position above the beverage holder tray.

10. The outdoor enclosure of claim 1, further comprising a stiffening panel attached to the inner surface of the door, wherein the beverage holder tray is mounted on the stiffening panel.

11. A method of using an outdoor enclosure, comprising:
   housing electronic components in a main compartment of the outdoor enclosure;
   opening a door of the enclosure;
   unfolding a beverage holder tray from a closed position to an open position;
   placing a beverage holder in the beverage holder tray; and
   working on the electronic components while drinking a beverage from the beverage holder.

12. The method of claim 11, further comprising:
   unfolding a laptop holder tray from a closed position to an open position;
   placing a laptop computer on the laptop holder tray; and
   working on the laptop computer.

* * * * *